United States Patent
Ogura

(10) Patent No.: US 6,489,654 B2
(45) Date of Patent: *Dec. 3, 2002

(54) SILICON-ON-INSULATOR (SOI) SUBSTRATE

(75) Inventor: Atsushi Ogura, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/518,692

(22) Filed: Mar. 3, 2000

(65) Prior Publication Data

US 2002/0153563 A1 Oct. 24, 2002

Related U.S. Application Data

(62) Division of application No. 09/292,948, filed on Apr. 16, 1999, now Pat. No. 6,211,041.

(30) Foreign Application Priority Data

Apr. 17, 1998 (JP) .......................................... 10-108202

(51) Int. Cl.$^7$ ................................................ H01L 29/72
(52) U.S. Cl. ........................ 257/347; 257/350; 257/362; 257/507; 257/914
(58) Field of Search ................................ 257/347, 350, 257/362, 507, 914

(56) References Cited

U.S. PATENT DOCUMENTS 5,543,636 A * 8/1996 Yamazaki ..................... 257/66

FOREIGN PATENT DOCUMENTS

| JP | H1-259539 | 10/1989 |
| JP | 1-259539 | 10/1989 |
| JP | 5-6883 | 1/1993 |

(List continued on next page.)

OTHER PUBLICATIONS

UCS semiconductor substrate technology workshop "Science of Silicon" Realize Co., Ltd. Jun. 1996, pp. 459–466.
Abe, Takao and 3 others "Future Development of Laminated SOI Wafers" Applied Physics, vol. 66, No. 11, Applied Physics Society, published Nov., 1997, pp. 1220–1224.

(List continued on next page.)

Primary Examiner—Edward Wojciechowicz
(74) Attorney, Agent, or Firm—Sughrue Mion, PLLC

(57) ABSTRACT

There is provided a method of fabricating a silicon-on-insulator substrate, including the steps of (a) forming a silicon substrate at a surface thereof with an oxygen-containing region containing oxygen at such a concentration that oxygen is not precipitated in the oxygen-containing region in later mentioned heat treatment, (b) forming a silicon oxide film at a surface of the silicon substrate, (c) implanting hydrogen ions into the silicon substrate through the silicon oxide film, (d) overlapping the silicon substrate and a support substrate each other so that the silicon oxide film makes contact with the support substrate, and (e) applying heat treatment to the thus overlapped silicon substrate and support substrate to thereby separate the silicon substrate into two pieces at a region into which the hydrogen ions have been implanted, one of the two pieces remaining on the silicon oxide film as a silicon-on-insulator active layer. The support substrate, the silicon oxide film located on the support substrate, and the silicon-on-insulator active layer formed on the silicon oxide film defines a silicon on-insulator structure. The method makes it possible to significantly reduce crystal defect density in the silicon-on-insulator active layer, which ensures that a substrate made in accordance with the method can be used for fabricating electronic devices thereon.

36 Claims, 2 Drawing Sheets

FOREIGN PATENT DOCUMENTS

| | | |
|---|---|---|
| JP | 6-216136 | 8/1994 |
| JP | H6-216136 | 8/1994 |
| JP | 7-263652 | 10/1995 |
| JP | 8-250688 | 9/1996 |
| JP | 9-22993 | 1/1997 |
| JP | H9-237884 | 9/1997 |
| JP | 9-237884 | 9/1997 |
| JP | H9-260619 | 10/1997 |
| JP | 9-260619 | 10/1997 |
| JP | 10-200080 | 7/1998 |
| JP | 11-191617 | 7/1999 |

OTHER PUBLICATIONS

C. Maleville et al., "Silicon–on–Insulator and Devices VII", Electrochemical Society Proceedings vol. 96–3, (1996), pp 34–46 with Abstract.

T. Abe et al., "Applied Physics", vol. 66, No., 11, (1997), pp 1220–1224.

"Surface Science Technology Series", pp. 459–466, published Jun. 28, 1999.

"Oyo Buturi" vol. 66 No. 11, pp. 1220–1224, published Nov., 1997.

* cited by examiner

SILICON-ON-INSULATOR (SOI) SUBSTRATE

This is a divisional of Application No. 09/292,948 filed Apr. 16, 1999 now U.S. Pat. No. 6,211,041, the disclosure of which is incorporated herein by reference.

BACKGROUND OF THE INVENTION

1. Field of the Invention

The invention relates to a method of fabricating a silicon-on-insulator substrate including an insulator and a silicon active layer formed on the insulator, and more particularly to such a method including a hydrogen ion separation process. The invention also relates to a silicon-on-insulator substrate suitable for a hydrogen ion separation process.

2. Description of the Related Art

A silicon-on-insulator (hereinafter, referred to as "SOI") structure including a silicon active layer formed on an insulator is considered promising as a substrate to be used for next generation LSI. There have been suggested various methods of fabricating an SOI substrate.

One of such various methods is a method having the steps of forming an oxide film on a surface of a silicon substrate, implanting hydrogen ions into the silicon substrate, overlapping the silicon substrate to a support substrate, and applying heat treatment to the thus overlapped silicon and support substrates to thereby separate the silicon substrate into two pieces at a region to which hydrogen ions have been implanted (hereinafter, this method is referred to as "hydrogen ion separation process").

Hereinbelow is explained the above-mentioned hydrogen ion separation process with reference to FIGS. 1A to 1F.

First, as illustrated in FIG. 1A, there are prepared a silicon substrate 1 and a support substrate 2. A silicon wafer having (100) plane or a plane slightly inclined relative to (100) plane as a principal plane is usually selected as the silicon substrate 1. The same silicon wafer as just mentioned is usually also selected as the support substrate 2.

Then, as illustrated in FIG. 1B, a silicon dioxide film 3 is formed at a surface of the silicon substrate 1. This silicon dioxide film 3 will make an insulating film in an SOI structure. Hence, the silicon dioxide film 3 is designed to have a thickness equal to a thickness of a buried oxide film required for fabrication of a device on an SOI substrate.

Then, as illustrated in FIG. 1C, hydrogen is ion-implanted into the silicon substrate 1 through the silicon dioxide film 3. The thus ion-implanted hydrogen 4 stays in the silicon substrate 1 at a certain depth. When the silicon substrate 1 is subject to heat treatment in a later step, the silicon substrate 1 is separated at that depth into two pieces. One of the two pieces to which the silicon dioxide film 3 belongs makes an SOI active layer in an SOI structure. Hence, in this step of ion-implanting hydrogen into the silicon substrate 1, acceleration energy is controlled for the SOI active layer to have a desired thickness. The silicon substrate 1 is usually implanted at about 30–200 KeV with doses of $1 \times 10^{16}$–$3 \times 10^{17}$H$^+$ cm$^{-2}$. The implanted hydrogen ions break bondings between silicon atoms in silicon crystal, and terminate non-bonded hands of silicon atoms.

Then, as illustrated in FIG. 1D, the silicon substrate 1 is laid on top of the support substrate 2 so that surfaces of them make direct contact with each other. Thereafter, the thus overlapped silicon substrate 1 and support substrate 2 are subject to heat treatment.

The heat treatment has two stages.

In a first stage, heat treatment to be carried out at a relatively low temperature in the range of 300 to 800 degrees centigrade is applied to the overlapped silicon substrate 1 and support substrate 2. By carrying out the first stage, the silicon substrate 1 and the support substrate 2 make close contact with each other, and at the same time, the silicon substrate 1 is separated into two pieces at the depth at which hydrogen 4 have been ion-implanted, as illustrated in FIG. 1E.

Hydrogen 4 having been ion-implanted into the silicon substrate 1 in the step illustrated in FIG. 1C is agglomerated at (111) plane or at (100) plane which is parallel to a surface of the silicon substrate 1, as a temperature raises in the first stage of the heat treatment, to thereby form cavities in the silicon substrate 1. If the support substrate 2 is not laid on the silicon substrate 1, a surface layer of the silicon substrate 1 would be peeled off by pressure of hydrogen gas generated in the first stage heat treatment carried out at 300–800 degrees centigrade.

However, in accordance with the hydrogen ion separation process, since the support substrate 2 makes close contact with the silicon substrate 1 with the silicon dioxide film 3 being sandwiched therebetween, the silicon substrate 1 is separated into two pieces one of which remains non-separated from the silicon dioxide film 3 and the support substrate 2. One of the two pieces, which remains on the silicon dioxide film 3, acts as an SOI active layer 5. Thus, there is formed an SOI structure including the support substrate 2, the silicon dioxide film 3 located on the support substrate 2, and the SOI active layer 5 formed on the silicon dioxide film 3. As mentioned above, the SOI active layer 5 is one of the two pieces of the silicon substrate 1.

The separation of the silicon substrate 1 into two pieces is considered partially because of force of deformation caused due to a difference in a thermal expansion coefficient between the support substrate 2 and the silicon dioxide film 3.

Then, in a second stage of the heat treatment, the SOI structure including the SOI active layer 5, the silicon dioxide film 3, and the support substrate 2 is subject to heat treatment at a relatively high temperature, specifically, at 1000 degrees centigrade or greater. Thus, as illustrated in FIG. 1F, there is completed an SOI substrate.

The second stage heat treatment is carried out for the purpose of enhancing bonding force between the support substrate 2 and the silicon dioxide film 3, because it would be impossible to ensure sufficient bonding force therebetween only by the first stage heat treatment.

In the specification, a silicon wafer is distinctive from a silicon substrate. Specifically, the term "silicon wafer" is used as a generic name for indicating a wafer manufactured by CZ process, for instance, whereas the term "silicon substrate" is used to indicate a substrate on which an active layer is to be formed in fabrication of an SOI substrate.

When fabrication of an SOI substrate by hydrogen ion separation process is repeated, the other of the two pieces of the silicon substrate 1, removed away in the above-mentioned first stage heat treatment, may be re-used as the silicon substrate 1 or as the support substrate 2 in next fabrication of an SOI substrate.

For instance, Japanese Unexamined Patent Publications Nos. 2-46770 and 9-22993 have suggested fabrication of an SOI substrate by such a hydrogen ion separation process as mentioned above.

Apart from those Publications, fabrication of an SOI substrate by a hydrogen ion separation process has been reported in (a) C. Maleville et al., Silicon-on-Insulator and Devices VII, pp. 34, Electrochem. Soc., Pennington, 1996, and (b) Abe et al., Applied Physics, Vol. 66, No. 11, pp. 1220, 1997.

The hydrogen ion separation process for fabrication of an SOI substrate, having been explained so far, has many advantages as follows, for instance, in comparison with other processes for fabrication of an SOI substrate.

First, it is possible to control a thickness of an SOI active layer, since a thickness of an SOI active layer is dependent on a range distance of ion-implanted hydrogen. The hydrogen ion separation process is suitable in particular for fabrication of a super-thin film SOI substrate.

Second, it is possible to uniformize a thickness of an SOI active layer, and an SOI substrate can readily have a large diameter.

Third, it is possible to reduce fabrication cost, because the hydrogen ion separation process is comprised of steps of ion-implantation and heat treatment both of which are compatible with an ordinary LSI fabrication process.

Fourth, great designability is ensured for thicknesses of an SOI active layer and a buried oxide film.

Fifth, an efficiency for using a wafer is higher than that of other SOI substrate fabrication processes. Specifically, an SOI substrate fabrication process such as a process including the steps of laying a first substrate on a second substrate, and polishing the first or second substrate to thereby make a thin film requires preparation of two wafers for fabrication of an SOI substrate. On the other hand, the hydrogen ion separation process requires preparation of only one wafer for fabrication of an SOI substrate by using a silicon wafer as a support substrate, and re-using a removed piece of a silicon substrate as a silicon or support substrate in next fabrication of an SOI substrate.

However, the hydrogen ion separation process is accompanied with a problem that a resultant SOI active layer includes a lot of crystal defects therein. An SOI active layer made in accordance with the conventional hydrogen ion separation process usually includes crystal defects by the number of about $1 \times 10^3$ to $1 \times 10^4/cm^2$. Such a lot of crystal defects exert harmful influence on characteristics of a device to be formed on an SOI active layer including the crystal defects.

From the standpoint of practical use, it is absolutely necessary to reduce a crystal defect density in an SOI active layer down to about $1 \times 10/cm^2$ or smaller in order to use an SOI substrate in next generation LSI.

However, not only a method of reducing crystal defects, but also the reason why crystal defects are generated have not been found so far.

SUMMARY OF THE INVENTION

In view of the above-mentioned problem, it is an object of the present invention to make it possible to reduce a crystal defect density in an SOI active layer in fabrication of an SOI substrate by means of a hydrogen ion separation process.

In one aspect of the present invention, there is provided a method of fabricating a silicon-on-insulator substrate, including the steps of (a) forming a silicon substrate at a surface thereof with an oxygen-containing region containing oxygen at such a concentration that oxygen is not precipitated in the oxygen-containing region in later mentioned heat treatment, (b) forming a silicon oxide film at a surface of the silicon substrate, (c) implanting hydrogen ions into the silicon substrate through the silicon oxide film, (d) overlapping the silicon substrate and a support substrate each other so that the silicon oxide film makes contact with the support substrate, and (e) applying heat treatment to the thus overlapped silicon substrate and support substrate to thereby separate the silicon substrate into two pieces at a region into which the hydrogen ions have been implanted, one of the two pieces remaining on the silicon oxide film as a silicon-on-insulator active layer, the support substrate, the silicon oxide film located on the support substrate, and the silicon-on-insulator active layer formed on the silicon oxide film defining a silicon-on-insulator structure.

It is preferable that the heat treatment in the step (e) is comprised of first heat treatment to be carried out at a temperature in the range of 300 to 800 degrees centigrade both inclusive, and second heat treatment to be carried out at a temperature in the range of 1000 to 1200 degrees centigrade.

It is preferable that the oxygen-containing region is designed to contain oxygen at a concentration equal to or smaller than $1 \times 10^{18}/cm^3$.

In the step (c), ions other than hydrogen ions may be also implanted into the silicon substrate together with the hydrogen ions through the silicon oxide film.

It is preferable that the method further includes the step (f) of forming an oxide film at a surface of the support substrate, the silicon substrate and the support substrate being overlapped each other in the step (d) so that the silicon oxide films of the silicon substrate and the support substrate make contact with each other.

It is preferable that the method further includes the step (g) of causing at least one of the silicon substrate and the support substrate to absorb hydroxyl group thereinto prior to carrying out the step (d).

For instance, the step (g) may be comprised of the steps of removing a natural oxide film out of a surface of the substrate(s), and rinsing the substrate(s) in super-pure water.

It is preferable that the method further includes the step (h) of selecting a material of which the support substrate is composed, among one of silicon, quartz glass, sapphire, SiC, and diamond.

It is preferable that the support substrate and the silicon substrate are designed to have common characteristics, and the method further includes the step of (i) using the other of the two pieces of the silicon substrate as a support substrate in next fabrication of a silicon-on-insulator substrate.

It is preferable that the method further includes the step of (i) using the other of the two pieces of the silicon substrate as a silicon substrate in next fabrication of a silicon-on-insulator substrate.

There is further provided a method of fabricating a silicon-on-insulator substrate, including the steps of (a) forming a silicon oxide film at a surface of a silicon substrate containing oxygen at such a concentration that oxygen is not precipitated in the silicon substrate in later mentioned heat treatment, (b) implanting hydrogen ions into the silicon substrate through the silicon oxide film, (c) overlapping the silicon substrate and a support substrate each other so that the silicon oxide film makes contact with the support substrate, and (d) applying heat treatment to the thus overlapped silicon substrate and support substrate to thereby separate the silicon substrate into two pieces at a region into which the hydrogen ions have been implanted, one of the two pieces remaining on the silicon oxide film as a silicon-on-insulator active layer, the support substrate, the silicon oxide film located on the support substrate, and the silicon-on-insulator active layer formed on the silicon oxide film defining a silicon-on-insulator structure.

It is preferable that the method further includes the step of making the silicon substrate by FZ process or MCZ process.

There is still further provided a method of fabricating a silicon-on-insulator substrate, including the steps of (a) forming a silicon substrate at a surface thereof with an oxygen-containing region containing oxygen at a lower concentration than a concentration of other regions of the silicon substrate so that oxygen is not precipitated in the oxygen-containing region in later mentioned heat treatment, (b) forming a silicon oxide film at a surface of the silicon substrate, (c) implanting hydrogen ions into the silicon substrate through the silicon oxide film, (d) overlapping the silicon substrate and a support substrate each other so that the silicon oxide film makes contact with the support substrate, and (e) applying heat treatment to the thus overlapped silicon substrate and support substrate to thereby separate the silicon substrate into two pieces at a region into which the hydrogen ions have been implanted, one of the two pieces remaining on the silicon oxide film as a silicon-on-insulator active layer, the support substrate, the silicon oxide film located on the support substrate, and the silicon-on-insulator active layer formed on the silicon oxide film defining a silicon-on-insulator structure.

It is preferable that the step (a) is carried out by applying heat treatment to the silicon substrate at 1000 degrees centigrade or greater in atmosphere containing oxygen at 1% or smaller, in which case, it is preferable that the heat treatment is carried out at 1300 degrees centigrade or smaller.

In another aspect of the present invention, there is provided a silicon-on-insulator substrate including (a) a substrate, (b) an insulating film formed on the substrate, and (c) a silicon layer containing oxygen at a concentration equal to or smaller than $1 \times 10^{18}/cm^3$.

It is preferable that the substrate contains hydroxyl group therein.

The substrate may be composed of one of silicon, quartz glass, sapphire, SiC, and diamond.

Hereinbelow is explained the principle of the present invention by which it is possible to fabricate an SOI substrate having crystal defects by the smaller number than crystal defects of an SOI substrate fabricated in accordance with a conventional hydrogen ion separation process.

The inventor inspected the reason why crystal defects are generated, and found out the following.

First, it was found out that a silicon substrate used in a conventional SOI substrate contained oxygen in a considerable amount, specifically, at a concentration of $1 \times 10^{18}/cm^3$ or greater. In fabrication of an SOI substrate from such a silicon substrate by a hydrogen ion separation process, two stages heat treatment to be carried out after overlapping a silicon substrate and a support substrate each other generates precipitation cores of oxygen contained in a silicon substrate, and facilitates precipitation of oxygen. As a result, oxygen originally contained in a silicon substrate is precipitated, and the thus precipitated oxygen causes deformation in a silicon substrate, which in turn causes dislocation and/or rod-shaped crystal defects. In conclusion, crystal defects in an SOI active layer fabricated by a hydrogen ion separation process are caused by oxygen originally contained in a silicon substrate.

It was further found out that if an SOI substrate was made from a silicon substrate containing oxygen at a relatively low concentration, even after the above-mentioned two stage heat treatment was applied, oxygen was suppressed from being precipitated, and as a result, it was possible to prevent generation of crystal defects in an SOI active layer.

A crystal defect density of an SOI active layer is not in proportion to an oxygen concentration of a silicon substrate.

It was found out, that if a silicon substrate contained oxygen at a critical concentration or smaller, crystal defects were no longer generated. It was also found out that such a critical oxygen concentration was dependent on conditions of heat treatment to be carried out in an SOI substrate fabrication process, and was about $1 \times 10^{18}/cm^3$ in ordinary conditions of heat treatment.

The above-mentioned phenomenon is considered that a silicon substrate has to contain oxygen at a critical concentration or greater in order that oxygen precipitation cores are generated during heat treatment, and that such a critical oxygen concentration is equal to about $1 \times 10^{18}/cm^3$.

Based on the above-mentioned discovery of the inventor, it is understood that it would be possible to prevent generation of crystal defects and thereby fabricate a qualified SOI substrate having less crystal defects by using a silicon substrate having a surface layer which will make an SOI active layer and which contains oxygen at a concentration of about $1 \times 10^{18}/cm^3$ or smaller.

In the present invention, there may be used a silicon substrate containing oxygen at a relatively low concentration. As an alternative, there may be used a silicon substrate containing oxygen at a relatively high concentration, after the silicon substrate is treated to reduce an oxygen concentration at a surface thereof For instance, a silicon substrate containing oxygen at a relatively low concentration, fabricated by FZ process or MCZ process, may be used without any pre-treatment. A silicon substrate containing oxygen at a relatively high concentration, fabricated by CZ process, may be used after an oxygen concentration at a surface thereof is reduced, for instance, by applying heat treatment in argon atmosphere thereto.

In order to strengthen a bonding force between a silicon oxide film to be formed on a surface of a silicon substrate, and a support substrate, a silicon substrate and/or a support substrate may be caused to absorb hydroxyl group (OH group) thereinto before overlapping them each other.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

In the first embodiment, there is used a silicon substrate containing oxygen at a relatively low concentration in place of a silicon substrate containing oxygen at a relatively high concentration which has been conventionally used. As explained hereinbelow, it is possible to fabricate an SOI substrate having a reduced crystal defect density in accordance with the first embodiment having the same steps as those of a conventional hydrogen ion separation process except that a silicon substrate containing oxygen at a relatively low concentration is used.

A method of fabricating an SOI substrate in accordance with the first embodiment is explained hereinbelow with reference to FIGS. 1A to 1F.

Figure 1A:
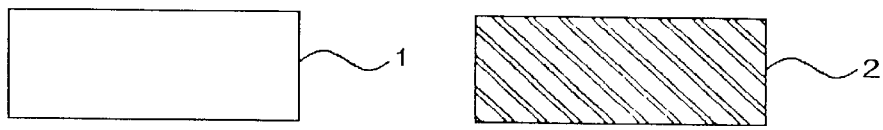
FIGS. 1A to 1F are cross-sectional views of an SOI substrate, illustrating respective steps of a method of fabricating an SOI substrate by a hydrogen ion separation process, in accordance with the first embodiment of the present invention.

First, as illustrated in FIG. 1A, there are prepared a silicon substrate 1 and a support substrate 2. As the silicon substrate 1, there is used a silicon wafer containing oxygen at a concentration of $1 \times 10^{18}/\text{cm}^3$ or smaller, fabricated by FZ or MCZ process, for instance. The silicon wafer 1 may have any plane azimuth. For instance, the silicon wafer 1 may have (100) plane, (111) plane or plane slightly inclined relative to (100) or (111) plane.

There may be used a silicon wafer as the support substrate 2. As an alternative, the support substrate 2 may be composed of glass which can withstand heat treatment to be later carried out at 1000 degrees centigrade or greater, such as quartz glass, sapphire, SiC, or diamond. The support substrate 2 may be formed at a surface thereof with a silicon dioxide film in advance.

Figure 1B:
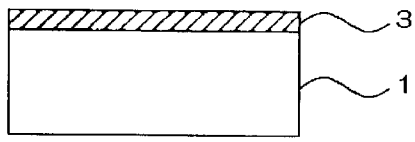

Then, as illustrated in FIG. 1B, a silicon dioxide film 3 is formed at a surface of the silicon substrate 1. This silicon dioxide film 3 will make an insulating film in an SOI structure. Hence, the silicon dioxide film 3 is designed to have a thickness equal to a thickness of a buried oxide film required for fabrication of a device on an SOI substrate.

The silicon dioxide film 3 is preferably formed by thermal oxidation in $O_2$ or $O_2$—$H_2$ atmosphere, because such thermal oxidation provides super characteristics as an oxide film to the silicon dioxide film 3. When the silicon dioxide film 3 is formed by thermal oxidation, not only a surface of the silicon substrate 1 but also all outer surfaces of the silicon substrate 1 are covered with the silicon dioxide film 3, which does not exert any harmful influence on later steps.

Figure 1C:
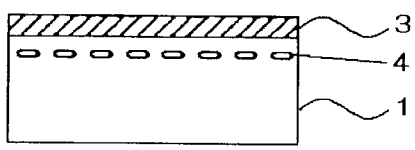

Then, as illustrated in FIG. 1C, hydrogen is ion-implanted into the silicon substrate 1 through the silicon dioxide film 3. The thus ion-implanted hydrogen 4 stays in the silicon substrate 1 at a certain depth. When the silicon substrate 1 is subject to heat treatment in a later step, the silicon substrate 1 is separated at that depth into two pieces. One of the two pieces to which the silicon dioxide film 3 belongs makes an SOI active layer in an SOI structure. Hence, in this step of ion-implanting hydrogen into the silicon substrate 1, acceleration energy is controlled so that the SOI active layer has a desired thickness. In the instant embodiment, the silicon substrate 1 is implanted at about 30–200 KeV with doses of $1 \times 10^{16} - 3 \times 10^{17} \, H^+ \, cm^{-2}$. The implanted hydrogen ions break bondings between silicon atoms in silicon crystal, and terminate non-bonded hands of silicon atoms.

Other ions different from hydrogen ions, such as helium ions, may be implanted into the silicon substrate 1 together with hydrogen ions. Such ion-implantation of hydrogen ions and other ions facilitates separation of the silicon substrate 1 in a later mentioned step.

Figure 1D:
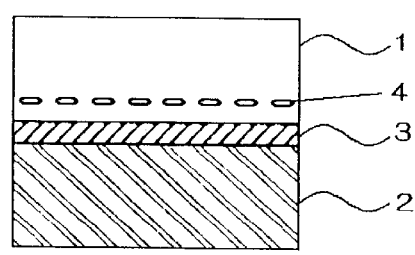

Then, as illustrated in FIG. 1D, the silicon substrate 1 is laid on top of the support substrate 2 so that surfaces of them make direct contact with each other. Thereafter, the thus overlapped silicon substrate 1 and support substrate 2 are subject to heat treatment, which is carried out in two stages.

In a first stage, heat treatment to be carried out at a relatively low temperature in the range of 300 to 800 degrees centigrade is applied to the overlapped silicon substrate 1 and support substrate 2. When the temperature is set high, the first stage heat treatment is carried out for a short period of time, whereas when the temperature is set low, the first stage heat treatment is carried out for a long period of time. For instance, when the first stage heat treatment is carried out at 800 degrees centigrade, the heat treatment lasts for about 10 minutes, whereas when the first stage heat treatment is carried out at 300 degrees centigrade, the heat treatment lasts for about 2 hours.

Figure 1E:
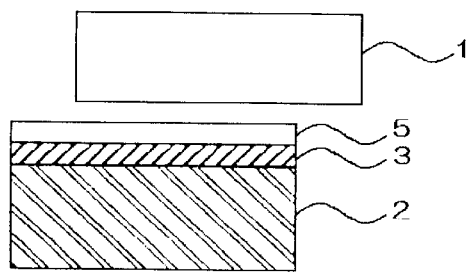

By carrying out the first stage heat treatment, the silicon substrate 1 and the support substrate 2 make close contact with each other, and at the same time, the silicon substrate 1 is separated into two pieces at the depth at which hydrogen 4 have been ion-implanted, as illustrated in FIG. 1E.

Since the support substrate 2 makes close contact with the silicon substrate 1 with the silicon dioxide film 3 being sandwiched therebetween, the silicon substrate 1 is separated into two pieces one of which remains non-separated from the silicon dioxide film 3 and the support substrate 2. One of the two pieces, which remains on the silicon dioxide film 3, makes an SOI active layer 5. Thus, there is formed an SOI structure including the support substrate 2, the silicon dioxide film 3 located on the support substrate 2, and the SOI active layer 5 formed on the silicon dioxide film 3. As mentioned above, the SOI active layer 5 is one of the two pieces of the silicon substrate 1.

Figure 1F:
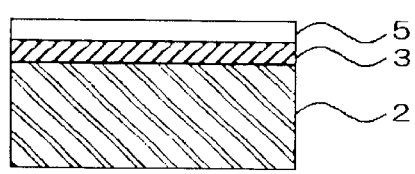

Then, in a second stage of the heat treatment, an SOI structure including the SOI active layer 5, the silicon dioxide film 3, and the support substrate 2 is subject to heat treatment at a relatively high temperature to thereby enhance a bonding force between the support substrate 2 and the silicon dioxide film 3. Thus, as illustrated in FIG. 1F, there is completed an SOI substrate.

The second stage heat treatment is carried out at about 1000 to 1200 degrees centigrade. Similarly to the first stage heat treatment, when the temperature is set high, the second stage heat treatment is carried out for a short period of time, whereas when the temperature is set low, the second stage heat treatment is carried out for a long period of time. For instance, when the second stage heat treatment is carried out at 1200 degrees centigrade, the heat treatment lasts for about 30 minutes, whereas when the second stage heat treatment is carried out at 1000 degrees centigrade, the heat treatment lasts for about 4 hours.

The thus fabricated SOI structure was estimated with respect to crystallinity of the SOI active layer 5 by a selective etching process, a transmission electron microscope process, an X-ray topography process, and a photoluminescence process. The results were that a crystal defect density of the SOI active layer 5 was equal to or smaller than $1 \times 10^{18}/\text{cm}^3$, if the SOI structure was fabricated in the conditions mentioned in the first embodiment. The results are sufficiently suitable for fabrication of LSI which is required to be fabricated smaller and smaller in size. Thus, the SOI structure in accordance with the instant embodiment makes it possible to completely solve the above-mentioned problem of a conventional hydrogen ion separation process.

Hereinbelow are explained examples of the first embodiment and reference examples.

EXAMPLE 1

In the first example, an SOI substrate was fabricated by a hydrogen ion separation process, using a silicon wafer, as the silicon substrate 1, which was fabricated by FZ process and contained oxygen at a concentration of $2 \times 10^{17}/\text{cm}^3$.

In the first example and all of examples and reference examples mentioned hereinbelow, a silicon wafer used was selected to have (100) plane as a principal plane.

In the first example, there were prepared six different support substrates A to F, as follows.

1. Support Substrate A

The support substrate A has the same structure as the silicon substrate 1. That is, the support substrate A was a silicon wafer fabricated by FZ process and containing oxygen at a concentration of $2 \times 10^{17}/cm^3$.

2. Support Substrate B

The support substrate B was fabricated by applying heat treatment at 1000 degrees centigrade in $O_2$ atmosphere to the support substrate A for thermal oxidation. Accordingly, the support substrate B was formed at a surface thereof with a 0.1 μm-thick oxide film.

3. Support Substrate C

The support substrate C was a silicon wafer fabricated by CZ process and containing oxygen at a concentration of $2 \times 10^{18}/cm^3$.

4. Support Substrate D

The support substrate D was fabricated by applying heat treatment at 1000 degrees centigrade in $O_2$ atmosphere to the support substrate C for thermal oxidation. Accordingly, the support substrate D was formed at a surface thereof with a 0.1 μm-thick oxide film.

5. Support Substrate E

The support substrate E was composed of quartz glass.

6. Support Substrate F

The support substrate F was composed of quartz glass and formed with at a surface thereof with a 0.1 μm-thick silicon dioxide film by chemical vapor deposition (CVD).

Then, heat treatment at 1000 degrees centigrade in $O_2$ atmosphere was applied to the silicon substrate 1 to thereby form a 0.1 μm-thick silicon dioxide film 3 at a surface of the silicon substrate 1, as illustrated in FIG. 1B.

Then, as illustrated in FIG. 1C, hydrogen was ion-implanted into the silicon substrate 1 through the silicon dioxide film 3. The thus ion-implanted hydrogen 4 stayed in the silicon substrate 1 at a certain depth. The silicon substrate 1 was implanted at 80 KeV with doses of $5 \times 10^{16} H^+ cm^{-2}$.

Then, the silicon substrate 1 having the structure as illustrated in FIG. 1C was laid on top of each one of the support substrates A to F so that surfaces of them make direct contact with each other, as illustrated in FIG. 1D. When the silicon substrate 1 illustrated in FIG. 1C was laid on top of the substrates B, D and F all of which had a silicon dioxide film at a surface, the silicon dioxide film 3 of the silicon substrate 1 and the silicon dioxide film of the support substrates B, D and F were overlapped each other.

Then, the thus overlapped silicon substrate 1 and support substrate 2 were subject to heat treatment at 500 degrees centigrade for 1 hour. As a result, the silicon substrate 1 was broken at a region at which hydrogen ions 4 have been implanted, into two pieces as illustrated in FIG. 1E. One of the two pieces of the silicon substrate 1 remains on the silicon dioxide film 3, and makes an SOI active layer 5.

Then, the thus fabricated structure including the support substrate 2, the silicon dioxide film 3, and the SOI active layer 5 was subject to heat treatment at 1100 degrees centigrade for 2 hours to thereby enhance a bonding force between the support substrate 2 and the silicon dioxide film 3.

Thus, there was completed an SOI structure, as illustrated in FIG. 1F.

In such a manner as mentioned above, there were fabricated six different SOI structures each including the support substrate A, B, C, D, E or F, the silicon dioxide layer 3, and the SOI active layer 5. Those six SOI structures had an SOI active layer having a crystal defect density smaller than 10 $cm^{-2}$.

EXAMPLE 2

In the second example, an SOI substrate was fabricated by a hydrogen ion separation process, using a silicon wafer, as the silicon substrate 1, which was fabricated by MCZ process and contained oxygen at a concentration of $5 \times 10^{17}/cm^3$.

In the second example, there were prepared six different support substrates A to F, as follows.

1. Support Substrate A

The support substrate A has the same structure as the silicon substrate 1. That is, the support substrate A was a silicon wafer fabricated by MCZ process and containing oxygen at a concentration of $5 \times 10^{17}/cm^3$.

2. Support Substrate B

The support substrate B was fabricated by applying heat treatment at 1000 degrees centigrade in $O_2$ atmosphere to the support substrate A for thermal oxidation. Accordingly, the support substrate B was formed at a surface thereof with a 0.1 μm-thick oxide film.

3–6. Support Substrates C–F

The support substrates C to F were the same as the support substrates C to F having been used in the first example.

In the same manner as the above-mentioned first example, there were fabricated six different SOI structures each including the support substrate A, B, C, D, E or F, the silicon dioxide layer 3, and the SOI active layer 5.

Those six SOI structures had an SOI active layer having a crystal defect density smaller than 10 $cm^{-2}$.

Reference Example

In the reference example, an SOI substrate was fabricated by a conventional hydrogen ion separation process, using a silicon wafer, as the silicon substrate 1, which was fabricated by CZ process and contained oxygen at a concentration of $2 \times 10^{18}/cm^3$.

In the reference example, there were prepared six different support substrates A to F, which were the same as the support substrates A to F having been used in the first example.

In the same manner as the above-mentioned first example, there were fabricated six different SOI structures each including the support substrate A, B, C, D, E or F, the silicon dioxide layer 3, and the SOI active layer 5.

The thus fabricated six SOI structures had an SOI active layer having a crystal defect density in the range of $1 \times 10^3$ to $1 \times 10^4$ $cm^{-2}$. The reason why the SOI active layer in the reference example had so high crystal defect density was that the SOI active layer contained a lot of crystal defects such as oxygen precipitate, dislocation caused by deformation in the SOI active layer which was in turn caused by oxygen precipitate, and rod-shaped defects. Those crystal defects were not found in the SOI substrates made in accordance with the above-mentioned first and second examples.

In view of comparison between the first and second examples and the reference example, it is understood that a crystal defect density of an SOI active layer can be decreased by using a silicon substrate containing oxygen at a relatively low concentration. Since a crystal defect density is not dependent on a particular support substrate, there may be selected a support substrate suitable for an SOI substrate to be fabricated.

If a silicon substrate containing oxygen at a relatively low concentration is used as both the silicon substrate 1 and the support substrate 2, as mentioned in the above-mentioned first and second examples wherein the supports substrates A and B are composed of the same silicon wafer as the silicon substrate 1, an unnecessary piece of the silicon substrate 1, removed away in the step illustrated in FIG. 1E, may be used as a support substrate in next SOI fabrication. Hence, a silicon wafer is wholly used for fabrication of an SOI substrate without any waste.

As an alternative, an unnecessary piece of the silicon substrate 1, removed away in the step illustrated in FIG. 1E, may be used as a silicon substrate in next SOI fabrication, in which case, it is not necessary for a support substrate to be composed of a silicon wafer.

[Second Embodiment]

In the second embodiment, a silicon wafer containing oxygen at a relatively high concentration is used as a silicon substrate after a region thereof close to a surface, at which an SOI active layer is to be formed, has been treated so as to reduce an oxygen concentration in the region. In the above-mentioned first embodiment, a silicon wafer containing oxygen at a relatively low concentration was used as the silicon substrate 1. However, an SOI active layer on which a device is to be fabricated occupies merely a part of a surface of a silicon substrate. Accordingly, if a region at which an SOI active layer is to be fabricated is designed to contain oxygen at a relatively low concentration, other region of the silicon substrate is allowed to contain oxygen at a relatively high concentration.

A method of fabricating an SOI substrate in accordance with the second embodiment is explained hereinbelow with reference to FIGS. 2A to 2F.

Figure 2A:
FIGS. 2A to 2F are cross-sectional views of an SOI substrate, illustrating respective steps of a method of fabricating an SOI substrate by a hydrogen ion separation process, in accordance with the second embodiment of the present invention.

In the second embodiment, a silicon substrate 1 is first processed so as to have a region 6 which contains oxygen at a relatively low concentration, as illustrated in FIG. 2A.

The silicon substrate 1 can be caused to have the region 6 by applying heat treatment at about 1000 to 1300 degrees centigrade in atmosphere containing oxygen at a concentration of about 1% or smaller to the silicon substrate 1 to thereby form a denuded zone at a region in the vicinity of a surface of the silicon substrate 1. The above-mentioned atmosphere may be established as inert gas atmosphere such as argon atmosphere.

As an alternative, a silicon epitaxial layer may be grown on a surface of the silicon substrate 1 in a conventional manner. The thus grown silicon epitaxial layer defines the region 6 containing oxygen at a relatively low concentration.

The region 6 is formed to have a thickness equal to or greater than a thickness of a later formed SOI active layer 5. Herein, a thickness of the SOI active layer 5 is equal to a depth of the silicon substrate 1 to which hydrogen ions are implanted in a later mentioned step illustrated in FIG. 2C.

The region 6 is designed to contain oxygen at a concentration equal to or smaller than $1\times10^{18}/cm^3$.

After the formation of the region 6 at a surface of the silicon substrate 1, the same steps as the steps of the first embodiment are carried out, as illustrated in FIGS. 2A to 2F.

First, as illustrated in FIG. 2A, there is prepared a support substrate 2.

There may be used a silicon wafer as the support substrate 2. As an alternative, the support substrate 2 may be composed of quartz glass, sapphire, SiC, or diamond. The support substrate 2 may be formed at a surface thereof with a silicon dioxide film in advance.

Figure 2B:
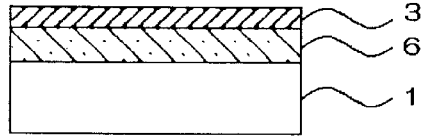

Then, as illustrated in FIG. 2B, a silicon dioxide film 3 is formed at a surface of the silicon substrate 1.

Figure 2C:
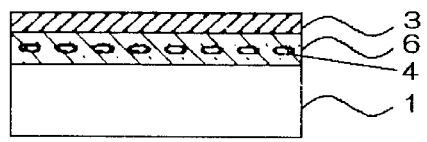

Then, as illustrated in FIG. 2C, hydrogen is ion-implanted into the silicon substrate 1 through the silicon dioxide film 3. The thus ion-implanted hydrogen 4 stays in the silicon substrate 1 at a certain depth.

Figure 2D:
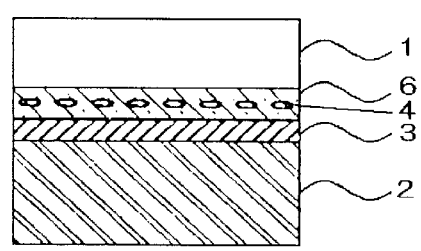

Then, as illustrated in FIG. 2D, the silicon substrate 1 is laid on top of the support substrate 2 so that surfaces of them make direct contact with each other. Thereafter, the thus overlapped silicon substrate 1 and support substrate 2 are subject to heat treatment, which is carried out in two stages.

In a first stage, heat treatment to be carried out at a relatively low temperature in the range of 300 to 800 degrees centigrade is applied to the overlapped silicon substrate 1 and support substrate 2.

Figure 2E:
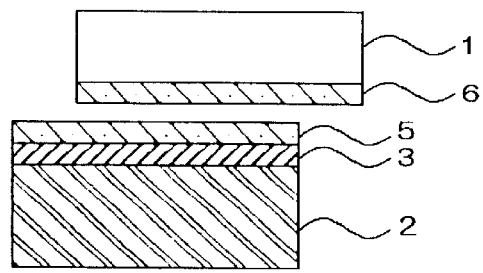

By carrying out the first stage heat treatment, the silicon substrate 1 and the support substrate 2 make close contact with each other, and at the same time, the silicon substrate 1 is separated into two pieces at the depth at which hydrogen 4 have been ion-implanted, as illustrated in FIG. 2E.

Since the support substrate 2 makes close contact with the silicon substrate 1 with the silicon dioxide film 3 being sandwiched therebetween, the silicon substrate 1 is separated into two pieces, one of which remains non-separated from the silicon dioxide film 3 and the support substrate 2. One of the two pieces, which remains on the silicon dioxide film 3, makes an SOI active layer 5. Thus, there is formed an SOI structure including the support substrate 2, the silicon dioxide film 3 located on the support substrate 2, and the SOI active layer 5 formed on the silicon dioxide film 3.

Figure 2F:
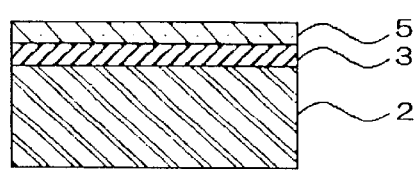

Then, in a second stage of the heat treatment, an SOI structure including the SOI active layer 5, the silicon dioxide film 3, and the support substrate 2 is subject to heat treatment at a relatively high temperature to thereby enhance a bonding force between the support substrate 2 and the silicon dioxide film 3. Thus, as illustrated in FIG. 2F, there is completed an SOI substrate.

Similarly to the first embodiment, one of two pieces of the silicon substrate 1, removed away in the step illustrated in FIG. 2E, may be used as a silicon substrate or a support substrate in next fabrication of an SOI substrate.

EXAMPLE 3

In the third example, there was used a silicon wafer fabricated by CZ process and containing oxygen at a concentration of as the silicon substrate 1. The silicon substrate 1 was formed at a surface thereof with the region 6 containing oxygen at a relatively low concentration. Then, an SOI substrate was fabricated by a hydrogen ion separation process.

The region 6 was formed by applying heat treatment in argon atmosphere to the silicon substrate 1 to thereby form a denuded zone. The heat treatment was carried out at 1200 degrees centigrade at atmospheric pressure in 100%-argon atmosphere for 5 hours. The thus formed region 6 had a depth of 10 $\mu$m and contained oxygen at a concentration of $8\times10^{17}/cm^3$.

In the third example, there were prepared four different support substrates A to D, as follows.

1. Support substrate A

The support substrate A was a silicon wafer fabricated by CZ process and containing oxygen at a concentration of $2\times10^{18}/cm^3$.

2. Support Substrate B

The support substrate B was fabricated by applying heat treatment at 1000 degrees centigrade in $O_2$ atmosphere to the support substrate A for thermal oxidation. Accordingly, the support substrate B was formed at a surface thereof with a 0.1 $\mu$m-thick oxide film.

3. Support Substrate C

The support substrate C was a substrate composed of quartz glass.

4. Support Substrate D

The support substrate D was a quartz glass substrate, and was formed at a surface thereof with a 0.1 μm-thick silicon dioxide film by CVD.

The SOI substrate in accordance with the third example was fabricated in the same manner as the SOI substrate in accordance with the first example. That is, there were fabricated four different SOI structures each including the support substrate A, B, C, or D, the silicon dioxide layer 3, and the SOI active layer 5. Those four SOI structures had an SOI active layer having a crystal defect density smaller than 10 $cm^{-2}$.

[Third Embodiment]

In the third embodiment, before the silicon substrate 1 is laid on top of the support substrate 2, the silicon substrate 1 and/or the support substrate 2 are(is) caused to absorb hydroxyl group (OH group) thereinto for enhancing a bonding force therebetween.

In the third embodiment, the silicon substrate 1 is selected among the silicon substrates 1 having been used in the above-mentioned first, second and third examples. There is used a silicon wafer as the support substrate 2.

The method of fabricating an SOI substrate in accordance with the third embodiment has the same steps of the methods of fabricating SOI substrates in accordance with the first and second embodiments, but has an additional step of causing hydroxyl group to be absorbed into the silicon substrate 1 and/or the support substrate 2 before those substrates 1 and 2 are overlapped each other. The substrates 1 and 2 can be caused to absorb hydroxyl group thereinto, for instance, by applying hydrofluoric (HF) acid treatment to the substrates 1 and/or 2 to thereby remove a natural oxidation film at a surface of the substrates 1 and/or 2, and then, rinsing the substrates 1 and/or 2 with super-pure water.

By causing the silicon substrate 1 and/or the support substrate 2 to absorb OH group thereinto, it is possible to enhance a bonding force between the substrates 1 and 2. Thus, there is obtained an SOI substrate having high practicability due to the advantages provided by the invention that a crystal defect density in the SOI active layer 5 can be decreased through the use of the silicon substrate 1 containing oxygen at a relatively low concentration, and that a bonding force between the silicon substrate 1 and the support substrate 2 can be enhanced, as mentioned above.

EXAMPLE 4

In the fourth example, there were used the silicon substrate 1 constituted of a silicon wafer fabricated by FZ process and containing oxygen at a concentration of $2 \times 10^{17}/cm^3$, and the support substrate 2 constituted of a silicon wafer fabricated by CZ process and containing oxygen at a concentration of $2 \times 10^{18}/cm^3$.

In the same way as the above-mentioned first example, the silicon substrate 1 was formed at a surface thereof with the silicon dioxide film 3, and hydrogen ions 4 were implanted into the silicon substrate 1 through the silicon dioxide film 3.

Then, the silicon substrate 1 and the support substrate 2 were treated in the following conditions A to D.

1. Condition A

Both the silicon substrate 1 and the support substrate 2 were subject to 49%-HF treatment to thereby remove a natural oxide film therefrom, and then, were rinsed with super-pure water to thereby cause OH group to be absorbed into the substrates 1 and 2 at their surfaces.

2. Condition B

Only the silicon substrate 1 was caused to absorb OH group thereinto in the same way as the condition A.

3. Condition C

Only the support substrate 2 was caused to absorb OH group thereinto in the same way as the condition A.

4. Condition D

Neither of the silicon substrate 1 and the support substrate 2 were caused to absorb OH group thereinto.

After the above-mentioned surface treatment of the silicon and support substrates 1 and 2 in the conditions A to D, each one of the silicon substrates 1 was laid on top of an associated one of the support substrates 2. Thereafter, the thus overlapped four silicon and support substrates 1 and 2 were subject to twostage heat treatment in the same way as the first example 1 to thereby fabricate four SOI substrates.

Those four SOI structures had an SOI active layer having a crystal defect density smaller than 10 $cm^{-2}$.

A bonding force between the support substrate 2 and the silicon dioxide film 3 in each of the SOI structures was measured by tensile stress process. It was found out that a bonding force was greater in the order of the conditions A, C, B and D. This result means that a bonding force can be increased by causing the silicon substrate 1 and/or the support substrate 2 to absorb OH group thereinto.

Though the support substrate 2 was constituted of a silicon wafer in the instant embodiment, the support substrate 2 may be composed of quartz glass, sapphire, SiC or diamond. As an alternative, the support substrate 2 composed of any one of those materials may be formed at a surface thereof with a silicon dioxide film.

It should be noted that conditions for fabricating an SOI substrate in accordance with each of the first to third embodiments might be modified. For instance, a method of and conditions for forming a silicon dioxide film on the silicon and support substrates 1 and 2 may be selected among conventional ones. Conditions for carrying out heat treatment, such as temperature, time and atmosphere, may be also varied. For instance, a washing step may be carried out between the above-mentioned steps of fabricating an SOI substrate.

While the present invention has been described in connection with the preferred embodiments and examples, the present invention makes it possible to significantly reduce a crystal defect density in an SOI active layer by using a silicon substrate containing oxygen at a relatively low concentration in fabrication of an SOI substrate. This ensures that a substrate made in accordance with the present invention can be used for fabricating electronic devices thereon Thus, the present invention gives life to the earlier mentioned advantages of a hydrogen ion separation process, and provides highly qualified SOI-structured electronic devices at low cost.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-108202 filed on Apr. 17, 1998 including specification, claims, drawings and summary is incorporated herein by reference in its entirety.

What is claimed is:

1. A silicon-on-insulator substrate comprising:
   (a) a substrate;
   (b) an insulating film formed on said substrate;
   (c) a silicon layer formed on said insulating film, said silicon layer containing oxygen at a concentration equal to or smaller than $1 \times 10^{18}/cm^3$; and
   (d) said substrate, said insulating film and said silicon layer forming a silicon-on-insulator substrate with a silicon-on-insulator active layer having a crystal defect density of $\leq 10$ cm$^{-2}$.

2. The silicon-on-insulator substrate in claim 1, wherein said substrate contains hydroxyl groups therein.

3. The silicon-on-insulator substrate in claim 1, wherein said substrate is composed of one of silicon, quartz glass, sapphire, SiC, and diamond.

4. A silicon-on-insulator substrate including a silicon-on-insulator active layer having a crystal defect density of 10 cm$^{-2}$, said silicon-on-insulator substrate being resulted from:
   (a) forming a silicon substrate thereof with an oxygen-containing region containing oxygen at such a concentration that oxygen is not precipitated in said oxygen-containing region in later mention ed heat treatment;
   (b) forming a silicon oxide film at a surface of said silicon substrate;
   (c) implanting hydrogen ions into said silicon substrate through said silicon oxide film;
   (d) placing said silicon substrate on a surface of a support substrate so that a top surface of said silicon oxide film makes contact with said surface of said support substrate to form a layered substrate; and
   (e) applying heat treatment to said layered substrate to thereby separate said silicon substrate in to two pieces at a region into which said hydrogen ions have been implanted, one of said two pieces remaining on said silicon oxide film as a silicon-on-insulator active layer.

5. The silicon-on-insulator substrate as set forth in claim 4, wherein said heat treatment is comprised of first heat treatment to be carried out at a temperature in the range of 300 to 800 degrees centigrade both inclusive, and second heat treatment to be carried out at a temperature in the range of 1000 to 1200 degrees centigrade.

6. The silicon-on-insulator substrate as set forth in claim 4, wherein said oxygen-containing region contains oxygen at a concentration equal to or smaller than $1 \times 10^{18}/cm^3$.

7. The silicon-on-insulator substrate as set forth in claim 4, wherein ions other than hydrogen ions are also implanted into said silicon substrate together with said hydrogen ions through said silicon oxide film in said step (c).

8. The silicon-on-insulator substrate as set forth in claim 4, wherein said silicon-on-insulator substrate is resulted further from (1) of forming an oxide film at a surface of said support substrate, said silicon substrate overlapping said support substrate in said step (d) so that said silicon oxide film of said silicon substrate and said support substrate make contact with each other.

9. The silicon-on-insulator substrate as set forth in claim 4, wherein said silicon-on-insulator substrate is resulted further from the step (g) of causing at least one of said silicon substrate and said support substrate to absorb hydroxyl groups there into prior to carrying out said step (d).

10. The silicon-on-insulator substrate as set forth in claim 9, wherein said step (g) is comprised of the steps of removing a natural oxide film out of a surface of said substrate(s), and rinsing said substrate(s) in super-pure water.

11. The silicon-on-insulator substrate as set forth in claim 4, wherein said silicon-on insulator substrate is resulted further from the step (h) of selecting a material of which said support substrate is composed, among one of silicon, quartz glass, sapphire, SiC, and diamond.

12. The silicon-on-insulator substrate as set forth in claim 4, wherein said support substrate and said silicon substrate are designed to have common characteristics, and further comprising the step of (i) using the other of said two pieces of said silicon substrate as a support substrate in next fabrication of a silicon-on-insulator substrate.

13. The silicon-on-insulator substrate as set forth in claim 4, wherein said silicon on-insulator substrate is resulted further from the step of (i) using the other of said two pieces of said silicon substrate as a silicon substrate in next fabrication of a silicon-on-insulator substrate.

14. A silicon-on insulator substrate including a silicon-on-insulator active layer having a crystal defect density of 10 cm$^{-2}$, said silicon-on-insulator being resulted from the steps of:
   (a) forming a silicon oxide film at a surface of a silicon substrate containing oxygen at such a concentration that oxygen is not precipitated in said silicon substrate in later mentioned heat treatment;
   (b) implanting hydrogen ions into said silicon substrate through said silicon oxide film;
   (c) placing said silicon substrate on a surface of support substrate so that a top surface of said silicon oxide film makes contact with said surface of said support substrate to form a layered substrate; and
   (d) applying heat treatment to substrate to thereby separate said silicon substrate into two pieces remaining on said silicon oxide film as a silicon-on-insulator active layer,
   said support substrate, said silicon oxide film located on said support substrate, and said silicon-on-insulator active layer formed on said silicon oxide film defining a silicon-on-insulator structure.

15. The silicon-on-insulator substrate as set forth in claim 14, wherein said silicon-on-insulator substrate is resulted further from the step of making said silicon substrate by FZ process or MCZ process.

16. The silicon-on-insulator substrate as set forth in claim 14, wherein said heat treatment in said step (d) is comprised of first heat treatment to be carried out at a temperature in the range of 300 to 800 degrees centigrade both inclusive, and second heat treatment to be carried out at a temperature in the range of 1000 to 1200 degrees centigrade.

17. The silicon-on-insulator substrate as set forth in claim 4, wherein said silicon substrate contains oxygen at a concentration equal to or smaller than $1 \times 10^{18}/cm^3$.

18. The silicon-on-insulator substrate as set forth in claim 14, wherein ions other than hydrogen ions are also implanted into said silicon substrate together with said hydrogen ions through said silicon oxide film in said step (b).

19. The silicon-on-insulator substrate as set forth in claim 14, wherein said silicon-on-insulator substrate is resulted further from the step (e) of forming an oxide film at a surface of said support substrate, aid silicon substrate overlapping said support substrate in said step (c) so that said silicon oxide films of said silicon substrate and said support substrate make contact with each other.

20. The silicon-on insulator substrate as set forth in claim 14, wherein said silicon-on-insulator substrate is resulted further from the step (f) of causing at least one said silicon substrate and said support substrate of absorb hydroxyl groups thereunto prior to carrying out said step (c).

21. The silicon-on-insulator substrate as set forth in claim 20, wherein said step (f) is comprised of the steps of removing a natural oxide film out of a surface of said substrate(s) and rinsing said substrate(s) in super-pure water.

22. The silicon-on-insulator substrate as set forth in claim 14, wherein said silicon-on-insulator substrate is resulted further from the step (g) of selecting a material of which said support substrate is composed, among one of silicon, quartz glass, sapphire, SiC, and diamond.

23. The silicon-on-insulator substrate as set forth in claim 14, wherein said support substrate and said silicon substrate are designed to have common characteristics, and further comprising the step of (h) using the other of said two pieces of said silicon substrate as a support substrate in next fabrication of a silicon-on-insulator substrate.

24. The silicon-on-insulator substrate as set forth in claim 14, wherein said silicon-on-insulator substrate is resulted further from the step of (h) using the other of said two pieces of said silicon substrate as a silicon substrate in next fabrication of a silicon-on-insulator substrate.

25. A silicon-on-insulator substrate including a silicon-on-insulator active layer having a crystal defect density of $10$ $cm^{-2}$, said silicon-on-insulator substrate being resulted from the steps of:

(a) forming a silicon substrate at a surface thereof with an oxygen-containing region containing oxygen at a lower concentration than a concentration of other regions of said silicon substrate so that oxygen is not precipitated in said oxygen-containing region in later mentioned heat treatment;

(b) forming a silicon oxide film at a surface of said silicon substrate;

(c) implanting hydrogen ions into said silicon substrate through said silicon oxide film;

(d) placing said silicon substrate on a surface of a support substrate so that a top surface of said silicon oxide film makes contact with said surface of said support substrate to form a layered substrate; and (e) applying heat treatment to said layered substrate to thereby separate said silicon substrate into two pieces remaining on said silicon oxide film as a silicon-on-insulator active layer;

said support substrate, said silicon oxide film located on said support substrate, and said silicon-on-insulator active layer formed on said silicon oxide film defining a silicon-on-insulator structure.

26. The silicon-on-insulator substrate as set forth in claim 25, wherein said step (a) is carried out by applying heat treatment to said silicon substrate at 1000 degrees centigrade or greater in atmosphere containing oxygen at 1% or smaller.

27. The silicon-on-insulator substrate as set forth in claim 26, wherein said heat treatment is carried out at 1300 degrees centigrade or smaller.

28. The silicon-on-insulator substrate as set forth in claim 25, wherein said heat treatment is said step (e) is comprised of first heat treatment to be carried out at a temperature in the range of 300 to 800 degrees centigrade both inclusive, and second heat treatment to be carried out at a temperature in the range of 1000 to 1200 degrees centigrade.

29. The silicon-on-insulator substrate as set forth in claim 25, wherein said oxygen containing region contains oxygen at a concentration equal to or smaller than $1 \times 10^{18}/cm^3$.

30. The silicon-on-insulator substrate as set forth in claim 25, wherein ions other than hydrogen ions are also implanted into said silicon substrate together with said hydrogen ions through said silicon oxide film in said step ((c).

31. The silicon-on-insulator substrate as set forth in claim 25, wherein said silicon-on-insulator substrate is resulted further from the step (l) of forming an oxide film at a surface of said support substrate, said silicon substrate overlapping said support substrate in said step (d) so that said silicon oxide films of said silicon substrate and said support make contact with each other.

32. The silicon-on-insulator substrate as set forth in claim 25, wherein said silicon-on-insulator is resulted further from the step (g) of causing at least one of said silicon substrate and said support substrate to absorb hydroxyl groups there into prior to carrying out said step (d).

33. The silicon-on-insulator substrate as set forth in claim 32, wherein said step (g) is comprised of the steps of removing on a natural oxide film out of a surface of said substrate(s) and rinsing said substrate(s) in super-pure water.

34. The silicon-on-insulator substrate as set forth in claim 25, wherein said silicon-on-insulator substrate is resulted further from the step (h) of selecting a material of which said support substrate is composed among one silicon quartz glass, sapphire, SiC and diamond.

35. The silicon-on-insulator substrate as set forth in claim 25, wherein said support substrate and said silicon substrate as designed to have common characteristics and further comprising the step of (i) using the other of said two piece of said silicon substrate as a support substrate in next fabrication of a silicon-on-insulator substrate.

36. The silicon-on-insulator as set forth in claim 25, wherein said silicon-on-insulator is resulted further from step of (i) using the other of said two pieces of said silicon substrate as a silicon substrate in next fabrication of silicon-on-insulator substrate.

* * * * *